United States Patent
Kajii

(10) Patent No.: US 8,317,076 B2
(45) Date of Patent: Nov. 27, 2012

(54) MINUTE BALL ARRAY APPARATUS

(75) Inventor: Yoshihisa Kajii, Kanazawa (JP)

(73) Assignee: Shibuya Kogyo Co., Ltd., Kanazawa-shi, Ishikawa-ken (JP)

( * ) Notice: Subject to any disclaimer, the term of this patent is extended or adjusted under 35 U.S.C. 154(b) by 20 days.

(21) Appl. No.: 12/546,051

(22) Filed: Aug. 24, 2009

(65) Prior Publication Data

US 2010/0044413 A1   Feb. 25, 2010

(30) Foreign Application Priority Data

Aug. 25, 2008   (JP) ............................. P.2008-215730

(51) Int. Cl.
*B23K 1/00* (2006.01)

(52) U.S. Cl. ........... 228/6.2; 228/4.1; 228/6.1; 228/245; 228/249

(58) Field of Classification Search ............... 228/110.1, 228/111.5, 178, 179.1, 180.1, 180.21, 180.22, 228/245, 246, 249, 253, 41; 29/843, 832; 257/E21.508; 438/612–616
See application file for complete search history.

(56) References Cited

U.S. PATENT DOCUMENTS

| | | | | |
|---|---|---|---|---|
| 5,655,704 | A  * | 8/1997 | Sakemi et al. | 228/246 |
| 7,455,209 | B2 * | 11/2008 | Bourrieres et al. | 228/41 |
| 7,886,955 | B2 * | 2/2011 | Kitamura | 228/41 |
| 2002/0058406 | A1* | 5/2002 | Mukuno et al. | 438/626 |
| 2009/0026247 | A1* | 1/2009 | Sakaguchi et al. | 228/180.22 |

FOREIGN PATENT DOCUMENTS

JP   2006-318994   11/2006

* cited by examiner

*Primary Examiner* — Maria Veronica Ewald
*Assistant Examiner* — Megha Mehta
(74) *Attorney, Agent, or Firm* — Drinker Biddle & Reath LLP

(57) ABSTRACT

A minute ball array apparatus includes: an array jig including insert parts, into which minute balls are to be inserted, and which are formed in a predetermined pattern; a ball moving unit, which comprises a thrust surface, and which moves the thrust surface along an upper surface of the array jig so as to move the minute balls supplied onto the upper surface of the array jig to drop the minute balls into the insert parts of the array jig; a collapsing member, which is provided in a vicinity of the thrust surface, and which collapses a buildup of the minute balls rising along the thrust surface when the thrust surface is moved by the ball moving unit; and a motion imparting unit that imparts the collapse member with motion for collapsing the rising buildup of the minute balls.

4 Claims, 3 Drawing Sheets

MINUTE BALL ARRAY APPARATUS

This application claims priority from Japanese Patent Application No. 2008-215730 filed on Aug. 25, 2008, the entire subject matter of which is incorporated herein by reference.

BACKGROUND OF THE INVENTION

1. Field of the Invention

The present invention relates to an improvement in a minute ball array apparatus and, more particularly, to a minute ball array apparatus arranged so as to make it easier to let minute balls fall into insertion parts, wherein a minute ball thrust surface is moved to an insertion part of an array jig where minute ball insertion parts are formed in a predetermined pattern, thereby letting the minute balls fall into the insertion parts.

2. Description of the Related Art

There has been proposed a related art minute ball array apparatus, in which a ball cup storing a plurality of minute balls is moved over an upper surface of an array mask serving as a minute ball array jig, and which drops the minute balls into insert holes of an array mask so as to mount the minute balls on an object to be mounted.

As shown in FIG. 5, in the related art minute ball array apparatus, the minute balls (solder balls 2) in a ball cup 4 accumulate in a vicinity of a rear-side thrust surface 41 in a moving direction of the ball cup 4 (a direction designated by an arrow in FIG. 5), thereby increasing the height of a heap 42 in a buildup. Adjacent minute balls in a lower stratum intensively push each other, thereby constraining their movements and often resulting in a failure to smoothly let the minute balls (the solder balls 2) fall into the insert holes 8 of the array mask 3.

Accordingly, in a minute ball array apparatus of minute ball drop type using an array mask, such as that described in connection with JP-A-2006-318994, the minute balls (the solder balls 2) accumulated around the thrust surface, which is a wall surface of the ball cup, are forwardly blown by air, to thereby preventing jamming of the solder ball and an increase in the heap 42 in the buildup of the solder balls 2. Dropping of the solder balls 2 into the insert holes 8 is thus facilitated. However, in the air-blow system, the solder balls once dropped in the insert holes spring out in a wind blast.

SUMMARY OF THE INVENTION

Accordingly, in order to solve the drawback, there is provided a collapsing member for collapsing a buildup of minute balls, and a heap of minute balls is collapsed without blowing off them, to thus prevent an increase in the height of the heap of minute balls.

Moreover, there is provided a minute ball array apparatus intended to prevent occurrence of ball jamming, wherein, as a result of collapse of a ball heap in a buildup, many heaps of minute balls in a forward-moving direction become lower, so that a higher ratio at which insert holes are filled with balls is achieved with a forward movement, and wherein, when the thrust surface passes over the insert holes, the minute balls are already inserted in almost all of the insert holes.

According to a first aspect of the invention, there is provided a minute ball array apparatus comprising: an array jig comprising insert parts, into which minute balls are to be inserted, and which are formed in a predetermined pattern; a ball moving unit, which comprises a thrust surface, and which moves the thrust surface along an upper surface of the array jig so as to move the minute balls supplied onto the upper surface of the array jig to drop the minute balls into the insert parts of the array jig; a collapsing member, which is provided in a vicinity of the thrust surface, and which collapses a buildup of the minute balls rising along the thrust surface when the thrust surface is moved by the ball moving unit; and a motion imparting unit that imparts the collapse member with motion for collapsing the rising buildup of the minute balls.

According to a second aspect of the invention, the minute ball array apparatus further comprises: a ball cup, which has a substantially cylindrical shape, and which stores the minute balls, wherein the thrust surface comprises: a first thrust surface that is a front interior surface in a moving direction of the ball cup; and a second thrust surface that is a rear interior surface in the moving direction of the ball cup, and wherein the collapsing member is provided between the first thrust surface and the second thrust surface.

According to a third aspect of the invention, in the minute ball array apparatus, wherein the ball moving unit comprises: a cup holder that imparts the ball cup with moving force; a drive unit that moves the cup holder; and a guide unit that guides movement of the cup holder.

According to a fourth aspect of the invention, in the minute ball array apparatus, the collapsing member is provided to the cup holder.

According to a fifth aspect of the invention, in the minute ball array apparatus, the motion imparting unit comprises a vibrator.

According to a sixth aspect of the invention, in the minute ball array apparatus, the collapsing member is provided at a position where a lower end of the collapsing member becomes higher than an upper surface of the array jig by an amount corresponding to a diameter of each minute balls.

According to the aspects of the invention, there are provided a collapsing member that collapses a buildup of minute balls rising along the thrust surface in the vicinity of each of the thrust surfaces, and a motion imparting unit that imparts the collapse members with motion for collapsing the rising buildup of minute balls. Accordingly, the heap made of minute balls is collapsed by collapsing motion of the collapsing members, and an increase in the heap of minute balls can be prevented.

As a result, a low multilayer area becomes broader in a forward moving direction, so that a higher ratio at which insert parts are filled with balls can be achieved in the forward direction. When the thrust surface passes over the insert parts, almost all of the insert parts are already filled with the minute balls. Thus, occurrence of ball jamming between the thrust surface and the array jig can be prevented.

According to the second aspect of the invention, a cylindrical ball cup that stores a plurality of minute balls is provided, interior surfaces of the ball cup located front and back in a moving direction act as the thrust surfaces, and the collapsing members are provided close to the respective interior thrust surfaces. Therefore, the aforementioned effect can be exhibited, even in either of forward-moving and backward-moving operations of the ball cup.

Further, according to the sixth aspect of the invention, a lower end of each of the collapsing members is set at a position that is higher than an upper surface of the array jig by an amount corresponding to a diameter of the minute ball. Therefore, force due to movement of the collapsing members is hardly transmitted to the minute balls in the insert parts. Accordingly, it can be reduced a risk where the minute balls in the insert parts move in their insert parts because of the

DETAILED DESCRIPTION OF THE PREFERRED EMBODIMENTS

A working mode of the present invention will be described with reference to the drawings.

The embodiment relates to a solder ball array apparatus. Incidentally, the present invention can also be utilized in another minute ball array apparatus that arrays conductive minute balls in respective insert parts of an array jig formed in a predetermined array pattern.

Figure 3:
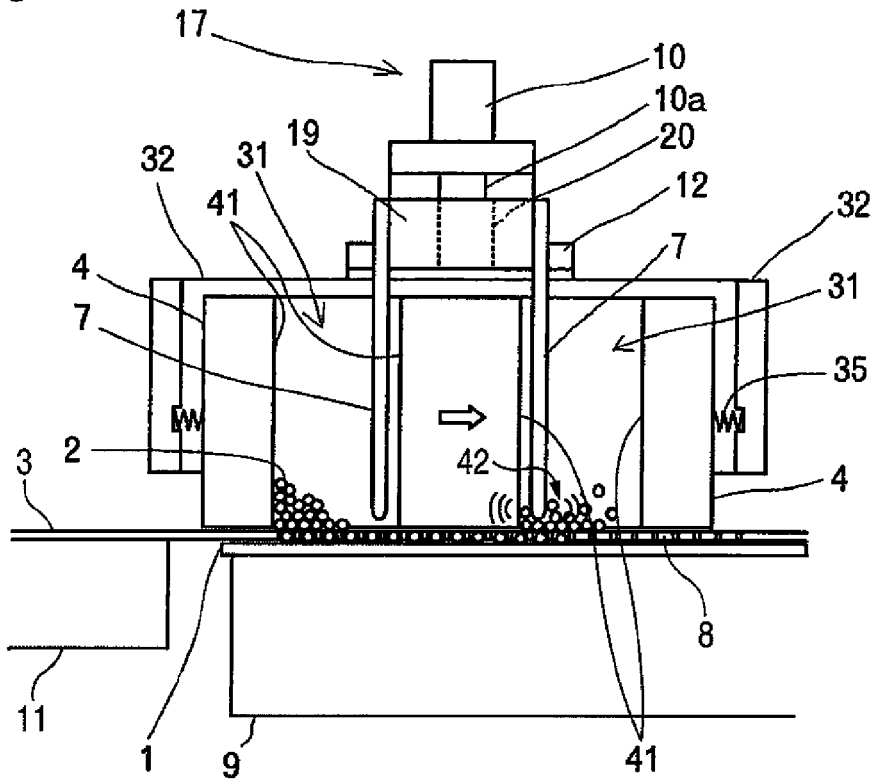
FIG. 3 is an enlarged explanatory view of collapse members utilizing reciprocal motion.

Minute balls of the present invention include conductive balls, such as solder balls, and silicon balls. An object on which the minute balls are to be mounted includes a semiconductor wafer (hereinafter described simply as a "wafer"), an electronic circuit board, a ceramic board, and others. As shown in FIG. 3, solder balls 2 are used as minute balls, and a wafer 1 is used as an object to be mounted in the present embodiment. Flux, a solder paste, a conductive adhesive, and the like, are used as an adhesive material. In the embodiment, flux is used, and electrodes on the wafer, on which the solder balls are to be mounted, are previously applied with flux.

Generally, the solder ball array apparatus includes a wafer carrying-in delivery part, a flux print part, a ball mounting part, and a wafer carrying-out part. Herein, the minute ball array apparatus according to the present invention is characterized by a ball mounting part. As shown in a FIGS. 1 and 3, the ball mounting part includes an array mask 3 that serves as an array jig and has insert holes 8 arranged in accordance with a pattern of electrodes on the wafer 1; a ball cup 4 for letting the solder balls 2 fall into the insert holes 8 of the array mask 3; and a wafer mount table 9 that can vertically move while holding, in an adsorbing manner, the wafer 1 shown in FIG. 3.

Figure 1:
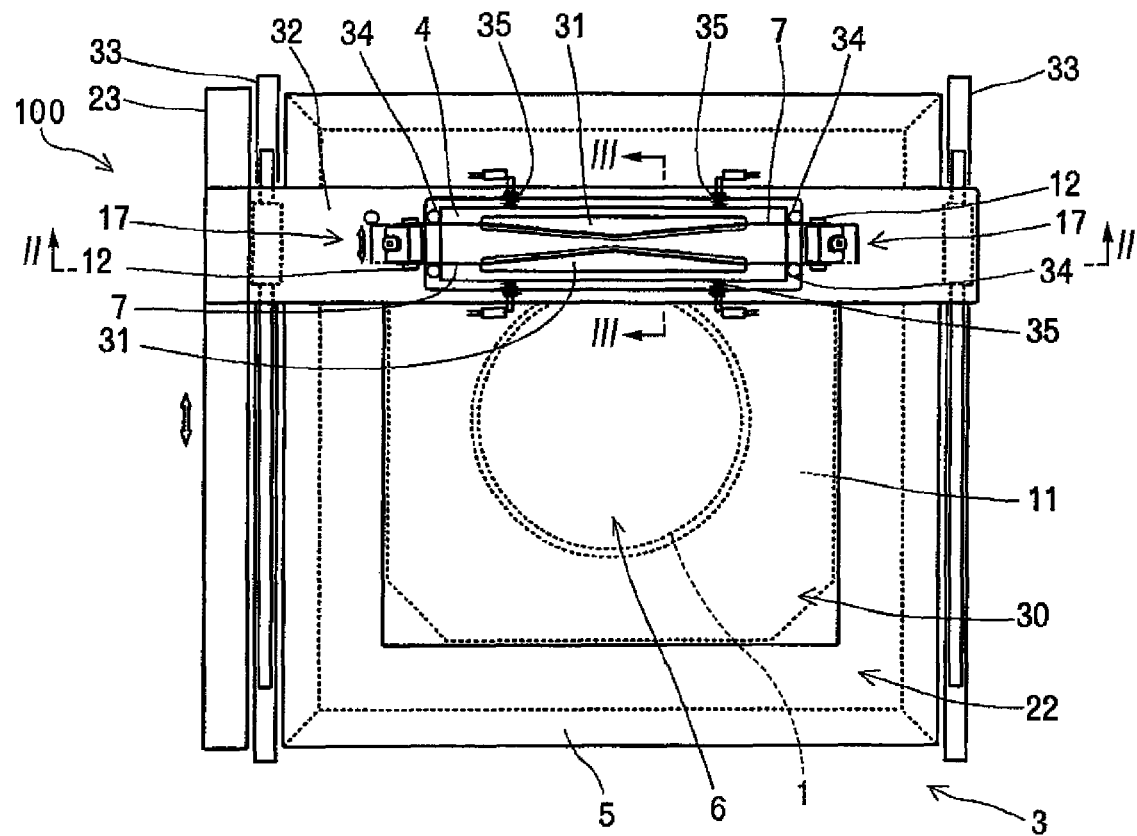
FIG. 1 is an explanatory plan view of a ball mounting part of a solder ball mounting apparatus according to an embodiment of the invention.

As shown in FIG. 1, the ball cup 4 has a cylindrical shape. The ball cup 4 includes two ball storage parts 31 storing the plurality of solder balls 2. The ball storage parts 31 pass above the through-holed area 6 of the array mask 3. An opening for supplying balls is formed in an upper portion of each of the ball storage parts 31, and an opening for dropping balls is formed in a bottom of each of the ball storage parts 31. Front and rear interior surfaces of each of the ball storage parts 31 in the moving direction of the ball cup 4 act as thrust surfaces 41 of the present invention. Incidentally, although the ball cup 4 of the embodiment includes two ball storage parts 31, the number of ball storage parts 31 may not be limited thereto. For example, the ball cup 4 may include one ball storage part or at least three ball storage parts.

The opening in the bottom of each of the ball storage parts 31 is formed to have a width that is greater than a width of the through-holed area 6 of the array mask 3 in a direction orthogonal to the moving direction. The ball storage parts 31 and the upper surface of the array mask 3 enable storage of the plurality of solder balls 2. Incidentally, as shown in FIG. 1, a width of the ball cup 4 is smaller than the width of the array mask 3.

A ball cup moving apparatus 100 that moves the ball cup 4 back and forth functions to a ball moving unit of the present invention. The ball cup moving apparatus 100 includes: a cup holder 32 that imparts forward and backward movement force to the ball cup 4; a Y-axis movement device 23 as a drive unit for moving the cup holder 32; and guide rails 33 as a guide unit used for moving the cup holder 32.

A space where the ball cup 4 is to be positioned is formed in the cup holder 32. The ball cup 4 is lightly held in the space by dint of feeble force resulting from forcing action of slide rollers 34 and springs 35, to thus be levitated to a slightly-elevated position from the array mask 3 without a contact with the array mask 3. Incidentally, the slide rollers 34 restrict horizontal displacement of the ball cup 4 with reference to the cup holder 32. If the ball cup 4 is situated at regular positions, the ball cup will not contact the cup holder 32.

The Y-axis movement device 23 is for moving the cup holder 32 holding the ball cup 4 back and forth at an elevated position above the array mask 3 by means of a ball screw rotated by a drive motor, and the like. The cup holder 32 is attached to the Y-axis movement device 23. The cup holder 32 is arranged so as to be freely movable along the guide rails 33. By means of the Y-axis movement device 23, the cup holder 32 moves back and forth along the guide rails 33.

In the array mask 3, edges of the metal mask 30, which is a mask metal part, are affixed to the hollow frame 5 by way of the gauze 22 that is an elastic sheet. Further, holding block members, which can be pulled outside and which act as projecting members, are attached to respective corners of the metal mask 30. The metal mask 30 is made of very thin metal, such as nickel. The through holes 8 measured so as to enable insertion and passage of the solder balls 2 are formed within the center through-holed area 6 so as to have a predetermined array pattern matching electrodes on the upper surface of the wafer 1.

Figure 2:
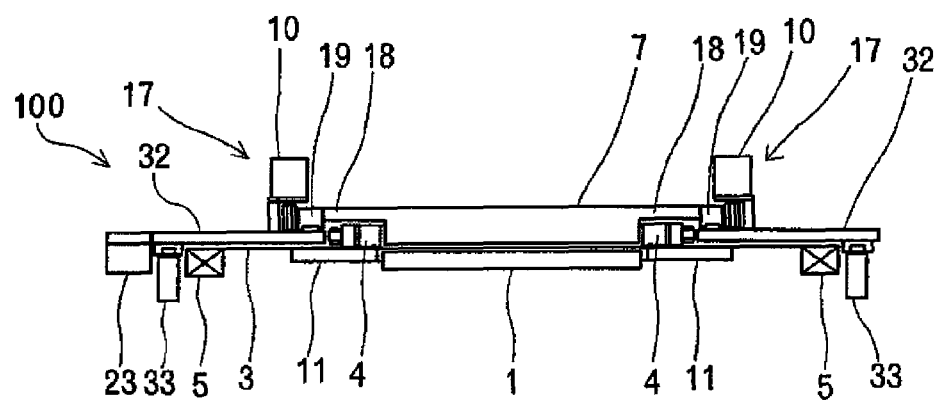
FIG. 2 is an explanatory front view of the ball mounting part.

As shown in FIG. 2, the array mask 3 is supported by the array mask supporting apparatus so as to situate at a position above the upper surface of the wafer 1 on which a surface for placing the solder balls 2 is formed, with appropriate spacing therebetween. Herein, FIG. 2 is a cross-sectional view taken along a line II-II of FIG. 1. The solder ball array apparatus includes a backup plate 11 that serves as a support member to be positioned so as to surround the wafer 1 placed on the wafer placement table 9 (see, for example, FIGS. 1 and 3). The backup plate 11 is made of plate-shaped stone having at its center an opening slightly larger than the wafer 1 and positioned so as to surround the wafer 1.

A motion imparting unit 17 is provided on an upper portion of the cup holder 32 with the ball cup 4 sandwiched therebetween. The plate-shaped two collapse members 7 are joined to the motion imparting unit 17. By means of the motion imparting unit 17, the two collapse members 7 are imparted with motion for collapsing the rising heap 42 in the buildup of solder balls 2 along the thrust surface 41 of the ball cup 4.

As shown in FIGS. 1 and 2, each of the collapse members 7 is an elongated, plate-shaped element whose lower portion is housed in the ball storage part 31 of the ball cup 4, and a joint part 18 joined to the motion impart unit 17 at a position above the ball cup 4 is formed in an upper portion of each of the collapse members 7. As shown in FIG. 3, a lower portion of each of the collapse members 7 is provided in the vicinity of the interior wall surface of the ball storage part 31 facing the front in the moving direction of the ball cup 4 and substantially in parallel with the interior wall surface. A lower end of the lower portion is set so as to become higher than the upper surface of the array mask 3 by the height of one solder ball 2. That is, the collapse members 7 are arranged so as not to directly contact the solder balls 2 remaining in contact with the array mask 3.

Figure 4:
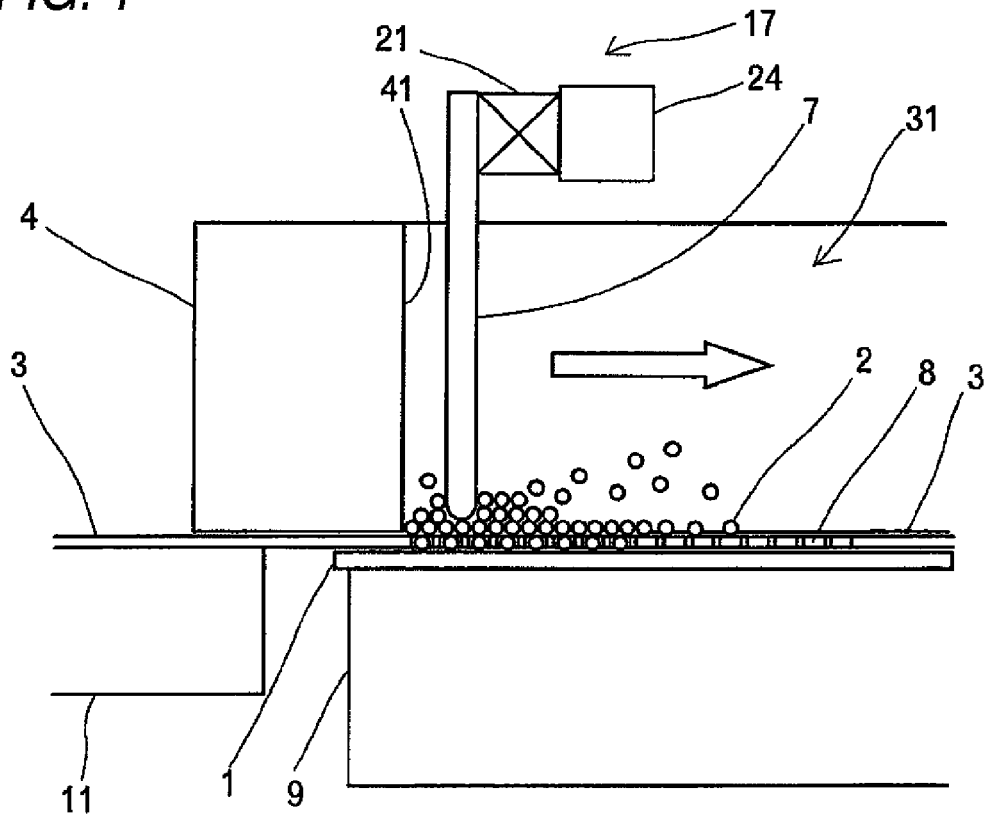
FIG. 4 is an enlarged explanatory view of collapse members utilizing vibration.
Figure 5:
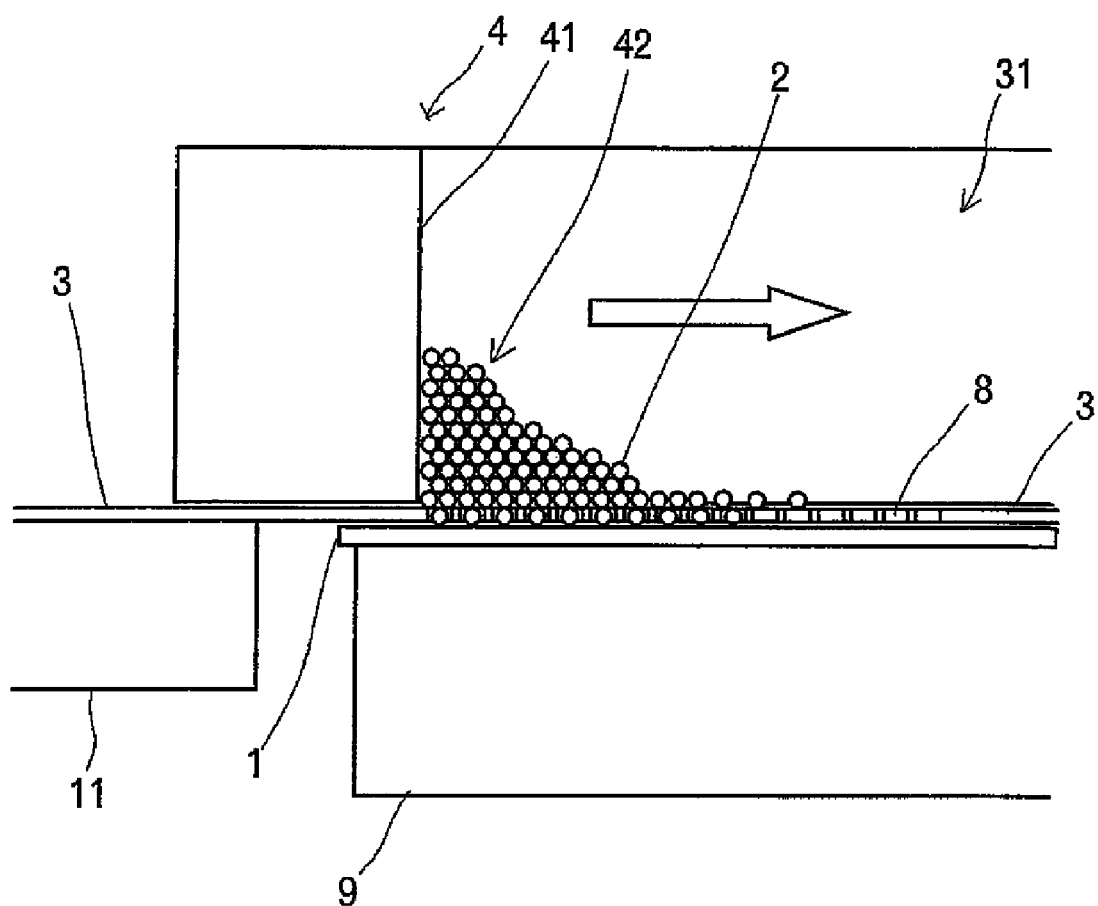
FIG. 5 is a descriptive view showing generation of a heap in a buildup of minute balls.

The motion imparting unit 17 of the embodiment includes one for imparting reciprocal motion to the collapse member 7 shown in FIG. 3 and the other for imparting vibration as shown in FIG. 4. Herein, FIG. 3 is a cross-sectional view taken along a line III-III of FIG. 1. When reciprocal movement is imparted, the motor 10 serves as a drive source for the motion imparting unit 17 as shown in FIG. 3. Eccentric pins 20 are secured on a motor shaft 10a of the motor 10, and the eccentric pins 20 are fitted into recessed grooves formed in respective side surfaces of a joint member 19, to front and back surfaces of which the two collapse members 7 are fixed. Further, the joint members 19 are attached to the slide guide 12 of the cup holder 32 so as to be slidable in the front-back direction. The joint members 19 are subjected to reciprocal movement by way of the eccentric pins 20 by driving action of the motor 10. Incidentally, helical movement can also be imparted to the collapse members 7 by rotatably attaching the eccentric pins 20 to the joint members 19.

When vibration is imparted, vibration sources like an ultrasonic vibration elements (vibrators) 21 are arranged, as shown in FIG. 4, and the ultrasonic vibration elements 21 and the collapse members 7 are fastened together. The collapse members 7 are vibrated by vibration of the ultrasonic vibration elements 21. The direction of vibration of the collapse members 7 achieved at this time is preferably the moving direction of the ball cup 4. Incidentally, reference numeral 24 of the drawing designates mount brackets for use with the ultrasonic vibration elements 21. The mount brackets 24 ate provided on the cup holder 32 so as to straddle the ball cup 4.

The heap 42 in the buildup of solder balls 2 can be collapsed by such motion of the collapsing members 7, whereby lower multilayer areas can be made broadened as a result of collapse of the heaps. As a matter of course, the collapsing members 7 are not limited to plate-shaped member, and comb-shaped members are also acceptable. Further, the motion imparting unit 17 is also not limited to reciprocation, rotation, vibration caused by the ultrasonic vibration element 21, and the like.

An appropriate amount of solder balls 2 are supplied to each of the two ball storage parts 31 of the ball cup 4 at the time of mounting balls. The cup holder 32 is moved by the Y-axis movement device 23 while reciprocal motion of the motion imparting unit 17 is imparted to the collapse members 7, whereby the solder balls 2 are dropped into the insert holes 8 of the array mask 3. At this time, in the ball storage part 31 that is located front in the moving direction as shown in FIG. 3, the collapse member 7 collapses the heap in the buildup of solder balls 2. Therefore, the solder balls 2 in the ball storage part 31 located front in the moving direction are filled in almost all of the insert holes 8. For example, even when some of the insert holes 8 are not filled, the thus-unfilled insert holes will finally be filled with the solder balls 2 in a multilayer-free area of the ball storage part 31 located rear in the moving direction. Therefore, occurrence of ball jamming can be avoided in the ball storage part 31 located rear in the moving direction, and thus the heap 42 in the buildup is not collapsed.

Since the ball cup 4 is moved while being pushed by the cup holder 32 by way of the springs 35, the motion of the motion imparting unit 17 and the vibration of the collapsing members 7 are absorbed by the springs 35, and the motion and the vibration are hardly transmitted to the ball cup 4.

If the collapsing members 7 and the motion imparting unit 17 are directly provided to the ball cup 4, the ball cup 4 itself will also move in accordance with the motion of the motion imparting unit 17 and/or the vibration of the collapsing members 7, and movement of the ball cup 4 may be transmitted to the solder balls 2 in the insert holes 8 via the solder balls 2 contacting the ball cup 4. In such a state, the solder balls 2 in the insert holes 8 that receive force due to the movement transmitted from the ball cup 4 will move within the respective insert holes 8, flux-applied portions of the solder balls 2 in the insert holes 8 may face up, and the flux may be adhered to another solder ball 2. In the present invention, since the lower end of each of the collapsing members 7 is set to a position higher than the solder balls 2 by an amount corresponding to the height of one solder ball, experimental results indicate that such a problem can be solved.

As described above, the solder balls 2 in the ball cup 4 can be smoothly dropped into the insert holes 8 of the array mask 3 by collapse of the heap 42 in the buildup of the solder balls 2.

What is claimed is:

1. A minute ball array apparatus comprising:
    an array jig comprising insert parts, into which minute balls are to be inserted, and which are formed in a predetermined pattern matching with a pattern of electrodes on an object to be mounted;
    an array jig supporting apparatus that supports the array jig at a position above the object to be mounted while matching the pattern of the insert parts with the pattern of the electrodes on the object to be mounted;
    a ball cup, which comprises a thrust surface in an interior surface thereof, which has a substantially cylindrical shape, and which stores the minute balls;
    a ball cup moving unit that moves the ball cup along an upper surface of the array jig supported by the array jig supporting apparatus while levitating the ball cup to an elevated position from the array jig so as to move the ball cup without a contact with the array jig;
    a collapsing member, which is provided so as to be moveable with respect to the thrust surface, and which collapses a buildup of the minute balls rising along the thrust surface when the ball cup moving unit is moved; and
    a motion imparting unit that imparts the collapse member with motion for directly contacting and collapsing the rising buildup of the minute balls.

2. The minute ball array apparatus according to claim 1, wherein the thrust surface of the ball cup comprises:
    a first thrust surface that is a front interior surface in a moving direction of the ball cup; and
    a second thrust surface that is a rear interior surface in the moving direction of the ball cup, and
    wherein the collapsing member is provided between the first thrust surface and the second thrust surface.

3. The minute ball array apparatus according to claim 2, wherein the ball cup moving unit comprises:
    a cup holder that imparts the ball cup with moving force;
    a drive unit that moves the cup holder; and
    a guide unit that guides movement of the cup holder.

4. The minute ball array apparatus according to claim 3, wherein the collapsing member is held by the cup holder.

* * * * *